(12) United States Patent
Simon et al.

(10) Patent No.: US 12,076,777 B2
(45) Date of Patent: Sep. 3, 2024

(54) DEVICE, IN PARTICULAR MACHINE, FOR PRODUCING A WIEGAND WIRE FROM A WIRE, IN PARTICULAR A PULSE WIRE, AND METHOD FOR OPERATING A DEVICE

(71) Applicant: SEW-EURODRIVE GMBH & CO. KG, Bruchsal (DE)

(72) Inventors: Olaf Simon, Untergrombach (DE); Dennis Rädle, Ettlingen (DE); Julian Hoffmann, Sippersfeld (DE); Daniel Simon Fuchs, Kronau (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 1200 days.

(21) Appl. No.: 16/497,144

(22) PCT Filed: Mar. 1, 2018

(86) PCT No.: PCT/EP2018/025055
§ 371 (c)(1),
(2) Date: Sep. 24, 2019

(87) PCT Pub. No.: WO2018/171944
PCT Pub. Date: Sep. 27, 2018

(65) Prior Publication Data
US 2021/0101202 A1 Apr. 8, 2021

(30) Foreign Application Priority Data
Mar. 24, 2017 (DE) .................. 10 2017 002 939.9

(51) Int. Cl.
*B21F 23/00* (2006.01)
*B21F 7/00* (2006.01)
(Continued)

(52) U.S. Cl.
CPC .............. *B21F 9/005* (2013.01); *B21F 7/00* (2013.01); *B21F 23/00* (2013.01); *B23B 31/24* (2013.01);
(Continued)

(58) Field of Classification Search
CPC ......... H01F 1/04; H01F 1/0304; B23B 31/24; B21F 23/00; B21F 7/00; B21F 9/005
(Continued)

(56) References Cited

U.S. PATENT DOCUMENTS 3,820,090 A * 6/1974 Wiegand ................ G06K 7/083
148/120
3,892,118 A 7/1975 Wiegand
(Continued)

FOREIGN PATENT DOCUMENTS

DE 2143326 C2 5/1972
DE 2819305 A1 11/1978
(Continued)

OTHER PUBLICATIONS

International Search Report issued Jun. 11, 2018, in International Application No. PCT/EP2018/025055 (English-language translation).
(Continued)

*Primary Examiner* — Livius R. Cazan
(74) *Attorney, Agent, or Firm* — Carter, DeLuca & Farrell LLP

(57) ABSTRACT

In a device, in particular machine, for producing Wiegand wire from a wire, in particular pulse wire, and a method for operating a device, the device having a first clamping chuck, a second clamping chuck, and a third clamping chuck, the wire being fed through each of the three clamping chucks, in particular so that the wire is able to be connected in a releasable and torsionally fixed manner to the three clamp-
(Continued)

ing chucks, in particular able to be connected to the three clamping chucks in a releasable, torsionally fixed and non-positive manner. The clamping chucks are set apart from one another in the wire direction, and the second clamping chuck is situated between the first and the third clamping chuck in the wire direction. The second clamping chuck is rotatably mounted so that a torsion is able to be applied to a first wire section and the reverse torsion is able to be applied to a second wire section, the first wire section being situated between the first clamping chuck and the second clamping chuck, the second wire section being situated between the third clamping chuck and the second clamping chuck. The distance in the wire direction between the first and the second clamping chuck is controllable and/or regulatable with the aid of a first linear actuator, and the distance in the wire direction between the second and the third clamping chuck is controllable and/or regulatable with the aid of a second linear actuator.

24 Claims, 3 Drawing Sheets

(51) Int. Cl.
| | | |
|---|---|---|
| *B21F 9/00* | (2006.01) | |
| *B23B 31/24* | (2006.01) | |
| *G01R 33/00* | (2006.01) | |
| *H01F 1/03* | (2006.01) | |
| *H01F 41/04* | (2006.01) | |

(52) U.S. Cl.
CPC ....... *G01R 33/0052* (2013.01); *H01F 1/0304* (2013.01); *H01F 41/04* (2013.01)

(58) Field of Classification Search
USPC ........................................................ 336/177
See application file for complete search history.

(56) References Cited

U.S. PATENT DOCUMENTS

| | | | | |
|---|---|---|---|---|
| 4,247,601 | A * | 1/1981 | Wiegand | H01F 1/0304 |
| | | | | 148/121 |
| 2004/0050446 | A1 | 3/2004 | Ichikawa | |
| 2008/0052887 | A1* | 3/2008 | Zhang | H01R 43/16 |
| | | | | 29/33 F |
| 2015/0135528 | A1* | 5/2015 | Buchmann | H01B 13/14 |
| | | | | 29/742 |

FOREIGN PATENT DOCUMENTS

| | | |
|---|---|---|
| EP | 0085140 A2 | 8/1983 |
| EP | 0710963 A1 | 5/1996 |
| GB | 1369903 A | 10/1974 |
| GB | 1604204 A | 12/1981 |
| GB | 2109280 A | 6/1983 |
| JP | H 04137600 U | 12/1992 |

OTHER PUBLICATIONS

International Preliminary Report on Patentability mailed from the International Bureau on Oct. 3, 2019.

* cited by examiner

DEVICE, IN PARTICULAR MACHINE, FOR PRODUCING A WIEGAND WIRE FROM A WIRE, IN PARTICULAR A PULSE WIRE, AND METHOD FOR OPERATING A DEVICE

FIELD OF THE INVENTION

The present invention relates to a device, in particular a machine, for producing Wiegand wire from a wire, in particular pulse wire, and to a method for operating a device.

BACKGROUND INFORMATION

Certain conventional power drills have clamping chucks by which a drill, i.e. an essentially cylindrical drilling tool, is able to be accommodated and connected in a nonpositive manner.

German Patent Document No. 28 19 305 describes a method for producing a Wiegand wire.

SUMMARY

Example embodiments of the present invention make it possible to produce a Wiegand wire in a cost-effective manner.

According to an example embodiment of the present invention, a device, in particular a machine, is provided to produce Wiegand wire from a wire, in particular pulse wire, the device having a first clamping chuck, a second clamping chuck and a third clamping chuck, and the wire being fed through each of the three clamping chucks, in particular so that the wire is able to be connected to the three clamping chucks in a releasable and torsionally fixed manner, in particular able to be connected to the three clamping chucks in a releasable, torsionally fixed and nonpositive manner. The clamping chucks are set apart from one another in the wire direction, the second clamping wire being situated between the first and the third clamping chuck in the wire direction. The second clamping chuck is rotatably mounted so that a torsion is able to be applied to a first wire section, and the reverse torsion is able to be applied to a second wire section. The first wire section is situated between the first clamping chuck and the second clamping chuck, and the second wire section is situated between the third clamping chuck and the second clamping chuck. The distance in the wire direction between the first and the second clamping chuck is able to be controlled or regulated with the aid of a first linear actuator, and the distance in the wire direction between the second and the third clamping chuck is able to be controlled or regulated with the aid of a second linear actuator.

This offers the advantage that clamping chucks are used for retaining the wire in a nonpositive manner. The wire is therefore able to be fed through the clamping chucks, so that a continuous production is possible, i.e. a production of the Wiegand wire without cutting the wire. Toward this end, the wire fed through the clamping chucks is retained in a nonpositive manner when the clamping chuck is operated, i.e. when the clamping chuck is locked. By rotating the second clamping chuck, i.e. the clamping chuck situated between the first and the third clamping chuck in the wire direction, the wire section to be processed is twistable. The wire section between the first and second clamping chuck is twisted in the opposite direction to the wire section situated between the second and third clamping chuck.

In addition to the torsion applied through the rotation, tensile stress is applied to the wire sections to be processed by increasing the distance between the second clamping chuck and the first clamping chuck and also by increasing the distance between the second clamping chuck and the third clamping chuck. Moreover, current may be applied to the wire in that the clamping chucks are fastened to the rest of the device in an electrically insulated manner. Thus, the application of an electrical voltage between the first and the third clamping chucks may be provided in order to apply a current to the wire with the goal of generating heat.

As an alternative, the application of current to the wire is also possible between the first and the second clamping chuck or between the second and the third clamping chuck.

Like the wire, the clamping chucks are metallic and thus electrically conductive.

Once the production has been completed, i.e. after the Wiegand wire characteristics have been produced in the two wire sections, the clamping chucks are opened and the wire advanced so that a newly to be processed section of the wire is moved between the first and third clamping chucks. The described production steps are then able to be repeated by closing the clamping chucks.

The first and second clamping chucks are moved back and forth by linear actuators in each case, in particular spindle motors, i.e. spindle drives driven by a respective electric motor. This is so because the respective distance to the second clamping chuck is varied or enlarged in the mentioned production step, and after the wire has been finished, the first and third clamping chucks are returned to their respective original positions. The clamping chucks may be opened following the production.

After opening of the clamping chucks, the first and second clamping chucks are returned to their original position.

The clamping chucks may be operated either manually or with the aid of an electromotoric drive, in particular a belt drive. As an alternative, however, a hydraulic, pneumatic or electrical operation is possible as well.

The term 'Wiegand wire' also refers to a pulse wire.

According to example embodiments, a voltage source is connected via its first pole to the first clamping chuck and via its second pole to the third clamping chuck, in particular so that current is able to be applied to the first and the second wire sections, the three clamping chucks being situated in an electrically insulated manner from the rest of the device. This offers the advantage that a current may be applied to the wire. Alternatively, the application of current to the wire may also be undertaken between the first and second clamping chucks or between the second and third clamping chucks.

According to example embodiments, the first clamping chuck is accommodated in a first stretching unit, the third clamping chuck is accommodated in a second stretching unit, and the second clamping chuck is rotatably accommodated in a torsion unit. This offers the advantage that the linear actuators, in particular the spindle drives, are able to move the stretching units, and consequently also the corresponding clamping chucks.

According to example embodiments, the third clamping chuck is rotatable by an electric motor of the torsion unit, in particular by a belt drive driven by a second electric motor. This is considered advantageous insofar as the torsion is easy to generate, the torsion unit being situated and retained on a base plate of the device in an electrically insulated manner.

According to example embodiments, the first linear actuator is able to linearly move the first stretching unit relative to the torsion unit, in particular in the wire direction or counter to the wire direction. This is considered advantageous insofar as the elongation is easy to produce, the stretching unit being situated and retained on a base plate of the device in an electrically insulated manner.

According to example embodiments, the second linear actuator is able to linearly move the second stretching unit relative to the torsion unit, in particular counter to the wire direction or in the wire direction. This is considered advantageous insofar as the elongation is easy to produce, the stretching unit being situated and retained on a base plate of the device in an electrically insulated manner.

According to example embodiments, the first linear actuator has a spindle drive which is driven by a first electric motor, the first electric motor in particular being firmly connected to a base plate, the rotor shaft of the electric motor being connected in a torsionally fixed manner to a spindle, which is in an operative connection with a spindle nut which is firmly connected to the first stretching unit, in particular to the first clamping chuck. This offers the advantage that the drive may be obtained in a simple and cost-effective manner and the linear actor may be placed and retained on the base plate.

According to example embodiments, the second linear actuator has a spindle drive driven by a third electric motor, the third electric motor in particular being firmly connected to the base plate, the rotor shaft of the third electric motor being connected in a torsionally fixed manner to a further spindle which is in an operative connection with a further spindle nut which is firmly connected to the second stretching unit, in particular to the third clamping chuck. This offers the advantage that the drive may be obtained in a simple and cost-effective manner and the linear actuator may be placed and retained on the base plate.

According to example embodiments, the torsion unit, in particular the second motor, is firmly connected to the base plate, and the second motor drives the belt drive which operates the second clamping chuck and/or rotates the second clamping chuck in order to generate torsion in the respective wire section to be processed. This is considered advantageous insofar as the device is a stable machine. In addition, holding devices provided with rotatably mounted rolls may be fixed in place on the base plate. A first roll is provided for the section of the wire that has not been processed yet, and a second roll is provided for the processed section of the wire, i.e. the produced Wiegand wire. When wound onto the second roll, large quantities of manufactured products are able to be stored in a compact manner. Prior to use, the Wiegand wire is then unwound from the second roll and the required wire sections are cut off. A wire piece for a Wiegand sensor is then able to be produced from each of these cut-off wire pieces.

According to example embodiments, the device has a sensor for detecting at least one magnetic quantity. This offers the advantage that the wire is able to be demagnetized by a demagnetizing unit and/or the wire quality be monitored on a continuous basis and/or the demagnetization achieved by a demagnetizing unit is able to be monitored.

According to example embodiments, the device includes at least one sensor for detecting a tensile stress in a wire section to be processed, in particular, the sensor for detecting the tensile stress being situated in the first and/or second stretching unit. This offers the advantage that a controlled, i.e. regulated, value of tensile stress is able to be generated.

According to example embodiments, the wire is made from a material that contains cobalt, iron and vanadium, more specifically, the vanadium component amounting to between 5% and 20%, the cobalt component amounting to between 40% and 65%, and the iron component amounting to between 35% and 65%. This has the advantage that a Wiegand wire is able to be produced which is of high quality and has a long service life.

According to an example embodiment of the present invention, in a method for operating a device, the section of the wire to be processed is fed through three clamping chucks, whereupon the clamping chucks are operated, in particular locked, so that the clamping chucks retain the wire in a nonpositive manner, whereupon the second clamping chuck is rotated, the axis of rotation being aligned coaxially to the wire direction. The distance between the first clamping chuck and the second clamping chuck is enlarged, and the distance between the third clamping chuck and the second clamping chuck is enlarged. A current is applied to the wire between the first and third clamping chucks, whereupon the clamping chucks are opened and the wire is advanced so that a newly to be processed section of the wire is fed through three clamping chucks and the mentioned method steps are repeated.

As an alternative, the application of current to the wire may also be carried out between the first and second clamping chucks or between the second and third clamping chucks.

This offers the advantage that a continuous production, i.e. a production without processing individual wire pieces, is able to be carried out. The wire is fed through the clamping chucks in a stop-and-go process, so to speak, and processed. The processed sections are available on the wire and wound onto the second roll.

According to example embodiments, the wire section exiting the third clamping chuck is demagnetized. This is considered advantageous insofar as a defined delivery state is able to be maintained.

As a result, a Wiegand wire is able to be produced in a continuous manner and at a high quality.

Further features and aspects of example embodiments of the present invention are described in greater detail below with reference to the appended Figures.

DETAILED DESCRIPTION

Figure 1:
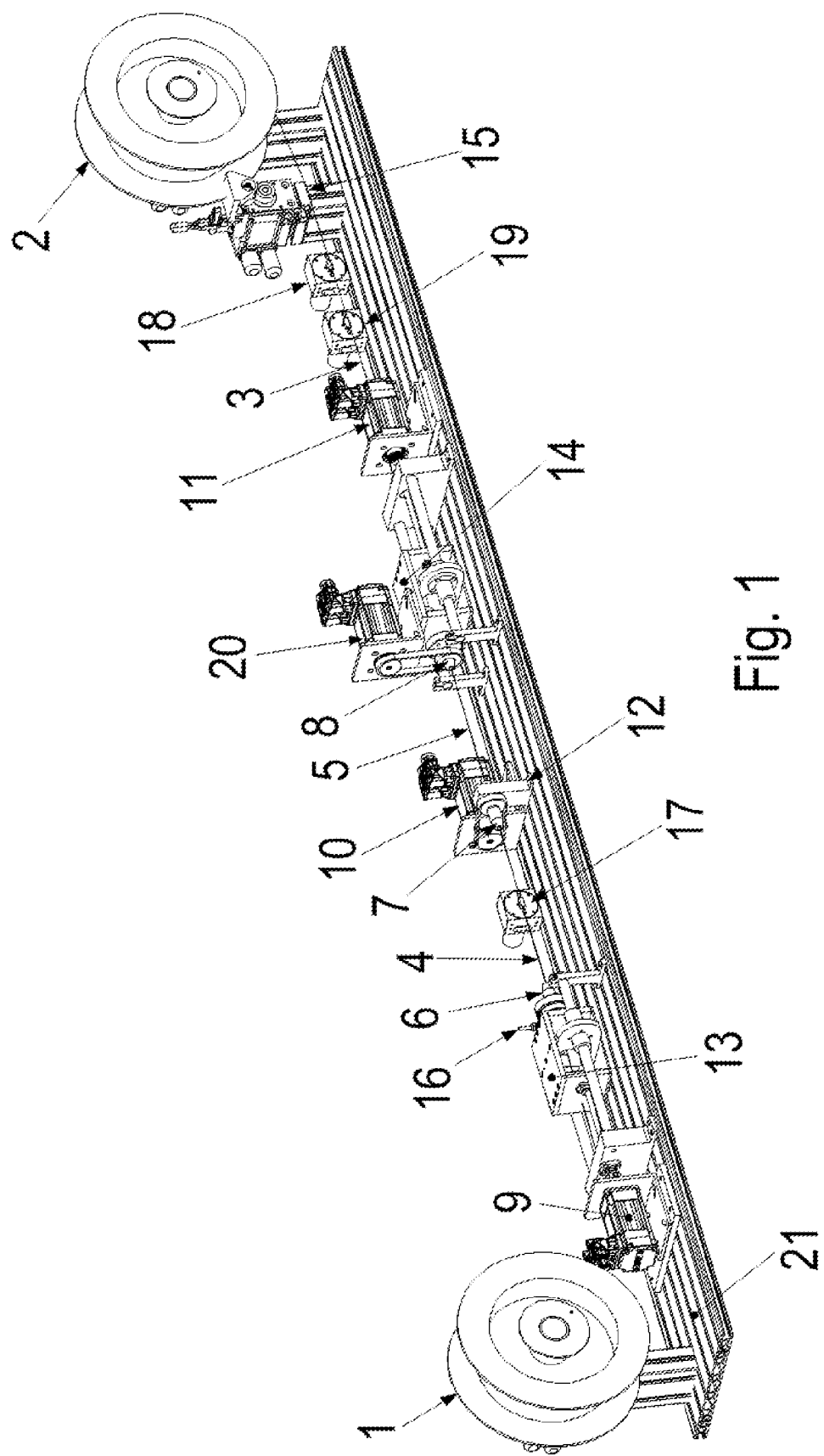
FIG. 1 is a perspective view of a system for producing Wiegand wire, i.e. pulse wire.
Figure 2:
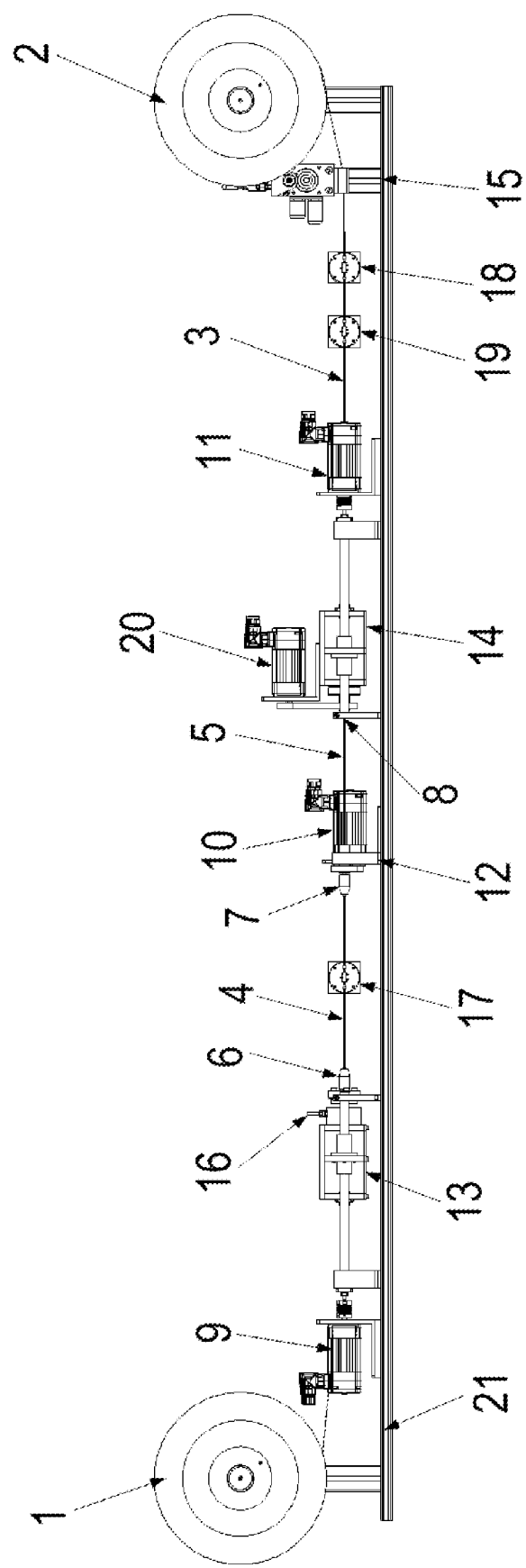
FIG. 2 is a side view of the system.
Figure 3:
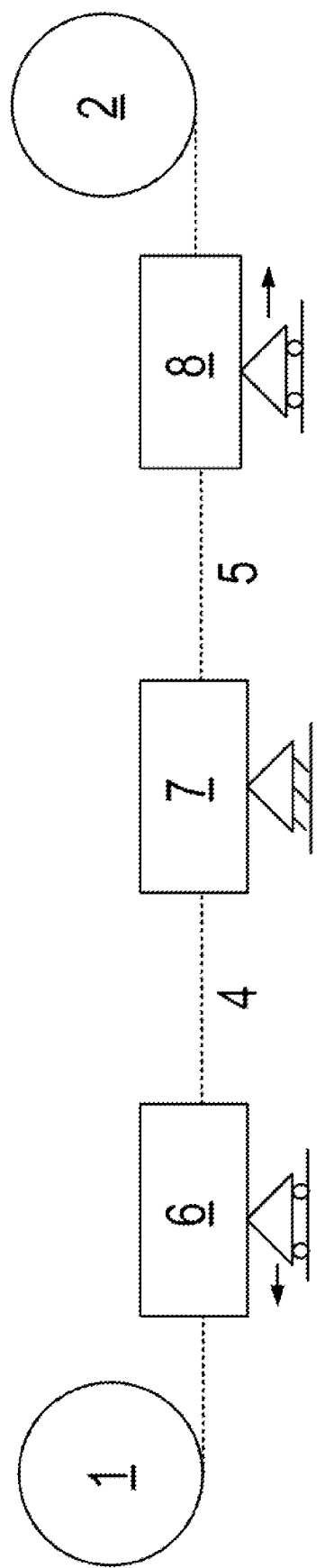
FIG. 3 illustrates a method of functioning of the system.

As schematically illustrated in FIGS. 1 to 3, the system has a first coil 1 on which the still unprocessed section of a wire 3 is wound as raw wire.

The section to be processed is passed through the system and the finished processed section of wire 3 is wound onto a second, rotatably mounted coil 2.

The section of wire 3 to be processed is connected in a nonpositive manner to a respective clamping chuck (6, 7, 8) at three locations which are set apart from one another in the wire direction. The clamping chucks (6, 7, 8) hold wire 3 at these locations, and clamping chuck 7, which is situated in the center in the wire direction, is rotated during the processing, the axis of rotation being aligned in parallel and/or coaxially with wire 3. This rotary motion carried out relative to the two other clamping chucks (6, 8) produces a first wire section 4, which is rotated in the opposite direction in comparison with a second wire section 5.

First wire section 4 lies between center clamping chuck 7 and first clamping chuck 6, which is situated closer to coil 1. Accordingly, the second wire section is situated between center clamping chuck 7 and third clamping chuck 8.

First clamping chuck 6 is movable relative to center clamping chuck 7, in particular along the wire direction. As a result, first wire section 4 is stretchable, i.e. variable in its length.

In the same manner, third clamping chuck 8 is movable relative to center clamping chuck 7, in particular along the wire direction. As a result, second wire section 5 is stretchable, i.e. variable in its length.

Center clamping chuck 7 is firmly connected to a base plate, i.e. the machine bed. Pivot bearings of coils 1 and 2 are also connected to this base plate as are linear actuators for the displacement of the first and third clamping chucks (6, 8).

Therefore, the production of the Wiegand wire is carried out by the following steps.

To begin with, the section of wire 3 to be processed is connected to clamping chucks 6, 7 and 8 in a nonpositive manner. Then, the rotation of center clamping chuck 7 in order to generate the torsion in the first and second wire sections (4, 5) is carried out and the first and third clamping chucks (6, 8) are moved away from center clamping chuck 7 for stretching purposes, i.e. an elongation.

For the linear movement of first clamping chuck 6, a first motor 9 is situated on base plate 21, which drives a spindle, in particular a ball bearing spindle, whose threaded region is in an operative connection with a spindle nut which is accommodated with first spindle chuck 6 in first stretching unit 13 and thus is firmly connected. With the aid of a rotary motion of first motor 9, first stretching unit 13 may thereby be moved back and forth parallel to the wire direction. In addition, a sensor 16 for detecting the tensile force or tensile stress of the section of wire 3 to be processed is situated on first stretching unit 13.

For the linear movement of second clamping chuck 6, a third motor 11 is situated on base plate 21, which drives another spindle, in particular also a ball bearing spindle, whose threaded region is in an operative connection with a spindle nut which is accommodated with third clamping chuck 8 in second stretching unit 14 and thus is firmly connected. With the aid of a rotary motion of third motor 11, second stretching unit 14 may thus be moved back and forth parallel to the wire direction.

First clamping chuck 6 may be operated manually.

Third clamping chuck 8 is able to be operated via a belt drive, which is drivable by a fourth motor 20. In a first direction of rotation of the rotor shaft of fourth motor 20, third clamping chuck 8 is opened, while it is closed in the opposite direction of rotation of the rotor shaft.

The second, i.e. center, clamping chuck 7, is also operated via a belt drive by a second motor 10. Motor 10 is not only used as a drive for opening or closing second clamping chuck 7, but also for generating the torsion.

Torsion unit 12 formed by second motor 10 and second clamping chuck 7 is electrically insulated from base plate 21 but firmly connected to it.

In an additional production step, a current is applied to the section of the wire to be processed so that a predefined temperature range is achieved. Toward this end, the three clamping chucks (6, 7, 8) as well as coils 1 and 2 are situated so as to be insulated from the base plate. It is therefore sufficient to apply a voltage between metallically arranged first and third clamping chucks 6 and 8 so that a current is flowing through the two wire sections (4, 5). Toward this end, wire 3 has a resistance such that the produced Ohmic heat makes it possible to achieve the intended temperature range of wire 3.

According to example embodiments, the voltage is applied between the first and second clamping chucks or between the second and third clamping chucks.

As illustrated in the Figures, after the mentioned production steps have been carried out, wire 3 is moved toward second coil 2 and wound onto it. A wire-advancement unit 15 is provided for this purpose, which drives coil 2 and thus causes the winding of the wire. The processed section is moved past a demagnetization unit 19 and past sensors 17 and 19.

With the aid of the machine, it is therefore possible to produce a wire 3 through torsion and elongation at a high temperature. In this manner, a Wiegand wire is produced from the raw wire, i.e. a pulse wire. The processed sections of wire 3 are wound up on second coil 2 and may be uncoiled and cut during subsequent use. Wire sections (4, 5) of 10 cm, for instance, are able to be produced without special effort.

As soon as the processed section has been wound, the clamping chucks (6, 7, 8) are tightened again and a section of wire 3 to be newly processed is thereby connected to the clamping chucks again (6, 7, 8) in a nonpositive manner. The production steps may then be repeated.

A quasi-continuous production is therefore possible in that a new section to be processed is continuously moved between first clamping chuck 6 and third clamping chuck 8 in a step-by-step manner, so to speak.

The quality is able to be checked while the produced Wiegand wire is passed along demagnetization unit 19 and then past sensor 18.

The wire is produced from a material that has, for example, a vanadium component of between 5% and 20%, a cobalt component of between 40% and 65%, and an iron component of between 35% and 60%.

The drives are controlled by a central control in that the latter predefines respective stretching and torsion characteristics. However, in particular the wire length of the produced wire is controllable as well, and the tensile stress, and thus also the wire elongation, are likewise controllable. In addition, the control may also predefine the time characteristic of the torsion, in particular the number of revolutions during the twisting, the direction of rotation and the angular speed when twisting the wire. In the same manner, the electrical voltage characteristics for energizing the wire are predefinable by the control. Even a fully automated achievement of an optimum of values of electrical and magnetic characteristics of the wire is possible in this manner. A wire breakage is also immediately detectable by sensor 16 for detecting the tensile force in the wire. In addition, sensor 16 may be used for monitoring the tensile force during the production process, which also means that the quality of the raw wire is able to be monitored and/or material faults may be detected.

According to example embodiments, first clamping chuck 6 may be manually operated.

LIST OF REFERENCE NUMERALS

1 coil for raw wire
2 coil for Wiegand wire
3 wire
4 first wire section
5 second wire section
6 first clamping chuck
7 second clamping chuck
8 third clamping chuck 9 first motor
10 second motor
11 third motor
12 torsion unit
13 first stretching unit
14 second stretching unit
15 wire advancement unit
16 tensile force sensor
17 sensor
18 sensor
19 demagnetization unit
20 fourth motor
21 base plate, metallic

The invention claimed is:

1. A device for producing a Wiegand wire and/or a pulse wire from a wire, comprising:
   a first clamping chuck;
   a second clamping chuck;
   a third clamping chuck;
   a first linear actuator; and
   a second linear actuator;
   wherein the clamping chucks are adapted to feed the wire therethrough, the wire being releasably connectable in a torsionally fixed manner to the three clamping chucks and/or connectable to the three clamping chucks in a releasable, torsionally fixed and nonpositive manner;
   wherein the clamping chucks are set apart from one another in a wire direction, the second clamping chuck being located between the first clamping chuck and the third clamping chuck in the wire direction;
   wherein the second clamping chuck is rotatably mounted to apply a torsion to a first wire section and to apply a reverse torsion to a second wire section, the first wire section being located between the first clamping chuck and the second clamping chuck, the second wire section being located between the third clamping chuck and the second clamping chuck;
   wherein the first linear actuator is adapted to control and/or regulate a distance in the wire direction between the first clamping chuck and the second clamping chuck; and
   wherein the second linear actuator is adapted to control and/or regulate a distance in the wire direction between the second clamping chuck and the third clamping chuck.

2. The device according to claim 1, wherein the three clamping chucks are electrically insulated from the rest of the device; and
   wherein: (a) a voltage source is connected by a first pole to the first clamping chuck and by a second pole to the third clamping chuck, to apply a current to the first wire section and the second wire section; (b) a voltage source is connected by a first pole to the first clamping chuck and by a second pole to the second clamping chuck, to apply a current to the first wire section; and/or (c) a voltage source is connected by a first pole to the second clamping chuck and by a second pole to the third clamping chuck, to apply a current to the second wire section.

3. The device according to claim 1, wherein the first clamping chuck is accommodated in a first stretching unit, the third clamping chuck is accommodated in a second stretching unit, and the second camping chuck is accommodated in a rotatable manner in a torsion unit.

4. The device according to claim 3, wherein an electric motor and/or a belt drive driven by an electric motor is adapted to rotate the second clamping chuck.

5. The device according to claim 3, wherein the first linear actuator is adapted to linearly move the first stretching unit relative to the torsion unit, in and/or counter to the wire direction, and/or the second linear actuator is adapted to linearly move the second stretching unit relative to the torsion unit, in and/or counter to the wire direction.

6. The device according to claim 3, wherein the first linear actuator includes a spindle drive driven by a first electric motor, the first electric motor being firmly connected to a base plate, a rotor shaft of the first electric motor connected in a torsionally fixed manner to a spindle operatively connected with a spindle nut firmly connected to the first stretching unit and/or to the first clamping chuck; and/or
   wherein the second linear actuator includes a spindle drive driven by a third electric motor, the third electric motor being firmly connected to the base plate, a rotor shaft of the third electric motor connected in a torsionally fixed manner to a further spindle operatively connect to a further spindle nut firmly connected to the second stretching unit and/or to the third clamping chuck.

7. The device according to claim 3, wherein the torsion unit and/or a second motor is firmly connected to a base plate, the second motor being adapted to drive a belt drive that operates the second clamping chuck and/or rotate the second clamping chuck to generate torsion in a respective wire section to be processed.

8. The device according to claim 3, further comprising a sensor adapted to detect a tensile stress in a wire section to be processed, and being located in the first and/or second stretching unit.

9. The device according to claim 1, further comprising a sensor adapted to detect at least one magnetic variable.

10. The device according to claim 1, wherein the second clamping chuck is rotatably mounted relative to the first clamping chuck and the third clamping chuck about an axis of rotation parallel to the wire direction to apply the torsion to the first wire section and to apply the reverse torsion to the second wire section.

11. The device according to claim 1, further comprising a base extending along the wire direction, the third clamping chuck being immovably fixed in the wire direction to the base, the first linear actuator being adapted to control and/or regulate the distance in the wire direction along the base between the first clamping chuck and the second clamping chuck, the second linear actuator being adapted to control and/or regulate the distance in the wire direction along the base between the second clamping chuck and the third clamping chuck.

12. A method for operating a device as recited in claim 1, comprising:
   feeding a section of the wire to be processed through the three clamping chucks;
   operating and/or closing the clamping chucks to hold the wire by the clamping chucks in a nonpositive manner;
   rotating the second clamping chuck in an axis of rotation coaxially aligned to the wire direction;
   varying and/or enlarging a distance between the first clamping chuck and the second clamping chuck and between the third clamping chuck and the second clamping chuck;
   applying a current to the wire between at least two of the clamping chucks; and
   opening the clamping chucks and advancing the wire so that a newly-to-be-processed section of the wire is fed through the three clamping chucks.

13. The method according to claim 12, wherein the wire is made of a material that includes cobalt, iron, and vanadium.

14. The method according to claim 12, wherein the wire is made of a material that includes between 5% and 20% vanadium, between 40% and 65% cobalt, and between 35% and 60% iron.

15. The method according to claim 12, wherein the feeding, the operating and/or closing, the rotating, the varying and/or enlarging, the applying, and the opening are performed repeatedly.

16. The method according to claim 12, wherein the current is applied in the applying step between the first clamping chuck and the third clamping chuck, between the first clamping chuck and the second clamping chuck, and/or between the second clamping chuck and the third clamping chuck.

17. The method according to claim 12, further comprising demagnetizing a wire section guided out of the third clamping chuck.

18. The method according to claim 12, further comprising detecting a tensile force of the wire in the first wire section and/or the second wire section.

19. The method according to claim 18, wherein the tensile force is detected with the aid of a tensile force sensor.

20. The method according to claim 12, further comprising:
   determining at least one physical quality of the wire; and
   controlling the device as a function of the physical quality to automatically obtain an optimal value of the physical quality.

21. The method according to claim 20, wherein the physical quality includes a value of an electrical and/or magnetic quality of the wire.

22. The method according to claim 12, wherein the second clamping chuck is rotatably mounted relative to the first clamping chuck and the third clamping chuck about an axis of rotation parallel to the wire direction to apply the torsion to the first wire section and to apply the reverse torsion to the second wire section.

23. The method according to claim 12, wherein the device includes a base extending along the wire direction, the third clamping chuck being immovably fixed in the wire direction to the base, the first linear actuator being adapted to control and/or regulate the distance in the wire direction along the base between the first clamping chuck and the second clamping chuck, the second linear actuator being adapted to control and/or regulate the distance in the wire direction along the base between the second clamping chuck and the third clamping chuck.

24. A device for producing a Wiegand wire and/or a pulse wire from a wire that is made of a material that includes cobalt, iron, and vanadium, comprising:
   a first clamping chuck;
   a second clamping chuck;
   a third clamping chuck;
   a first linear actuator; and
   a second linear actuator;
   wherein the clamping chucks are adapted to feed the wire therethrough, the wire being releasably connectable in a torsionally fixed manner to the three clamping chucks and/or connectable to the three clamping chucks in a releasable, torsionally fixed and nonpositive manner;
   wherein the clamping chucks are set apart from one another in a wire direction, the second clamping chuck being located between the first clamping chuck and the third clamping chuck in the wire direction;
   wherein the second clamping chuck is rotatably mounted to apply a torsion to a first wire section and to apply a reverse torsion to a second wire section, the first wire section being located between the first clamping chuck and the second clamping chuck, the second wire section being located between the third clamping chuck and the second clamping chuck;
   wherein the first linear actuator is adapted to control and/or regulate a distance in the wire direction between the first clamping chuck and the second clamping chuck; and
   wherein the second linear actuator is adapted to control and/or regulate a distance in the wire direction between the second clamping chuck and the third clamping chuck.

* * * * *